(12) United States Patent
Takahashi et al.

(10) Patent No.: US 8,536,680 B2
(45) Date of Patent: Sep. 17, 2013

(54) ESD PROTECTION CIRCUIT AND SEMICONDUCTOR DEVICE

(75) Inventors: Yukio Takahashi, Kanagawa (JP); Kousuke Yoshida, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 804 days.

(21) Appl. No.: 12/457,037

(22) Filed: May 29, 2009

(65) Prior Publication Data

US 2009/0302423 A1 Dec. 10, 2009

(30) Foreign Application Priority Data

Jun. 5, 2008 (JP) ................................ 2008-147570

(51) Int. Cl.
*H01L 27/102* (2006.01)
(52) U.S. Cl.
USPC ...... 257/578; 257/355; 257/546; 257/E29.03; 257/E29.034
(58) Field of Classification Search
USPC ................ 257/355, 546, 560, 563, 578, 579, 257/580, E29.029, E29.03, E29.034
See application file for complete search history.

(56) References Cited

U.S. PATENT DOCUMENTS 6,770,953 B2 * 8/2004 Boeck et al. .................. 257/578

FOREIGN PATENT DOCUMENTS

| CN | 1397094 A | 2/2003 |
|---|---|---|
| JP | 10-223846 | 8/1998 |
| JP | 2000-269440 | 9/2000 |
| JP | 2001-223277 | 8/2001 |
| JP | 2003-522414 A | 7/2003 |

OTHER PUBLICATIONS

Chinese Office Action dated Jun. 26, 2012 with an English translation thereof.
Notification of Examination Opinion with English translation dated Sep. 26, 2012.
Notification of Examination Opinion with English translation dated Jan. 29, 2013.
Notification of Reasons for Refusal with English translation dated Jun. 13, 2013.

* cited by examiner

*Primary Examiner* — Matthew E Warren
(74) *Attorney, Agent, or Firm* — McGinn IP Law Group, PLLC

(57) ABSTRACT

An electrostatic discharge protection circuit has a bipolar transistor which includes a first diffusion layer of a first conductive type connected with a first power supply and functioning as a base; a second diffusion layer of a second conductive type connected with a second power supply and functioning as a collector; and a third diffusion layer of the second conductive type connected with an input/output pad and functioning as an emitter. An area of a first region of the third diffusion layer which is opposite to the first diffusion layer is larger than an area of a second region of the second diffusion layer which is opposite to the first diffusion layer.

18 Claims, 7 Drawing Sheets

Fig. 11

ESD PROTECTION CIRCUIT AND SEMICONDUCTOR DEVICE

INCORPORATION BY REFERENCE

The present application claims priority con convention based on Japanese Patent Application No. 2008-147570. The disclosure thereof is incorporated herein by reference.

BACKGROUND OF THE INVENTION

1. Field of the Invention

The present invention relates to an ESD (electrostatic discharge) protection circuit for protecting an internal circuit from ESD.

2. Description of Related Art

In recent years, the improvement of reliability of a semiconductor device has been required in various fields. For example, in particular, high reliability is required in the semiconductor device used in a product affecting human life due to a fault as in driver circuits for a vehicle-mounted car navigation system and a medical liquid crystal monitor. In order to realize high reliability in these products, it is necessary to increase a resistance to an overvoltage (or ESD) from the outside. More specifically, the semiconductor device with high ESD resistance has been demanded.

A conventional technique for enhancing ESD resistance in LSI (Large Scale Integrated circuit) include a protection circuit (i.e. ESD protection circuit) arranged in the periphery of an LSI chip. The ESD protection circuit prevents an internal element (or internal circuit) of LSI from being destroyed by changing a current path of ESD inputted from the outside.

Figure 1:
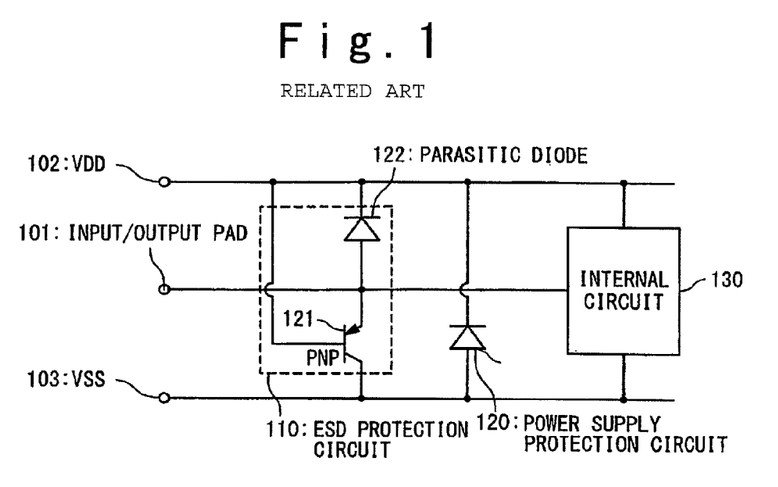
FIG. 1 is a block diagram showing one example of a semiconductor device having an ESD protection circuit.

FIG. 1 shows an example of an equivalent circuit of LSI (or semiconductor device) provided with an ESD protection circuit and a power supply protection circuit. Referring to FIG. 1, the LSI includes an input/output pad 101 for inputting/outputting an external signal, a VDD interconnection 102 to be connected to a higher power supply VDD, a VSS interconnection 103 to be connected to a lower power supply VSS, an ESD protection circuit 110, a power supply protection circuit 120, and an internal circuit 130.

The ESD protection circuit 110 is provided with a PNP bipolar transistor 121 which is connected to the input/output pad 101, and a parasitic diode 122. The PNP bipolar transistor 121 has an emitter (E) connected to the input/output pad 101, a base (B) connected to the VDD interconnection 102 (i.e. higher power supply VDD), and a collector (C) connected to the VSS interconnection 103 (i.e. lower power supply VSS). The parasitic diode 122 also has an anode (A) connected to the input/output pad 101, and a cathode (K) connected to the VDD interconnection 102 (i.e. higher power supply VDD).

The power supply protection circuit 120 has a diode with an anode (A) connected to the lower power supply VSS and a cathode (K) connected to the higher power supply VDD. When an ESD voltage is applied between the VDD interconnection 102 and the VSS interconnection 103, an ESD current flows in the power supply protection circuit 120 to protect the internal circuit 130.

The ESD protection circuit according to a conventional technique is disclosed in Japanese Patent Application Publication Nos. JP-A-Heisei 10-223846 (related art 1), JP-P2001-223277A (related art 2), and JP-P2000-269440A (related art 3).

Figure 2:
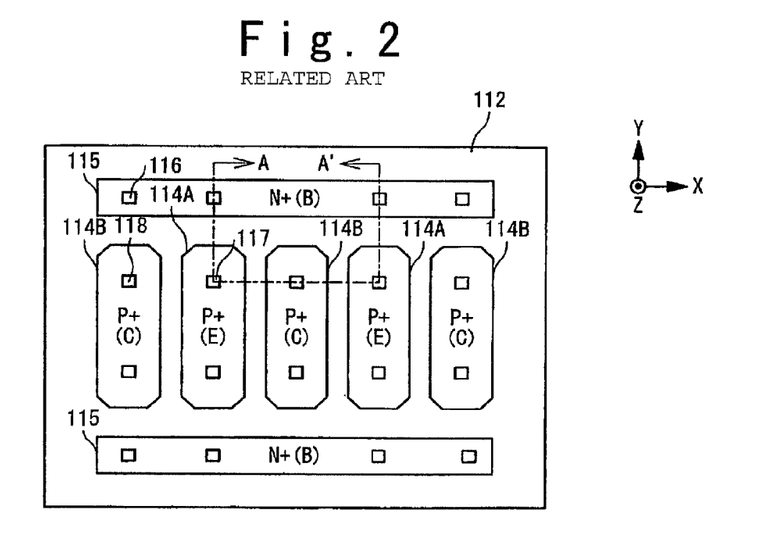
FIG. 2 is a plan view showing one layout example of an ESD protection circuit according to a conventional technique.
Figure 3:
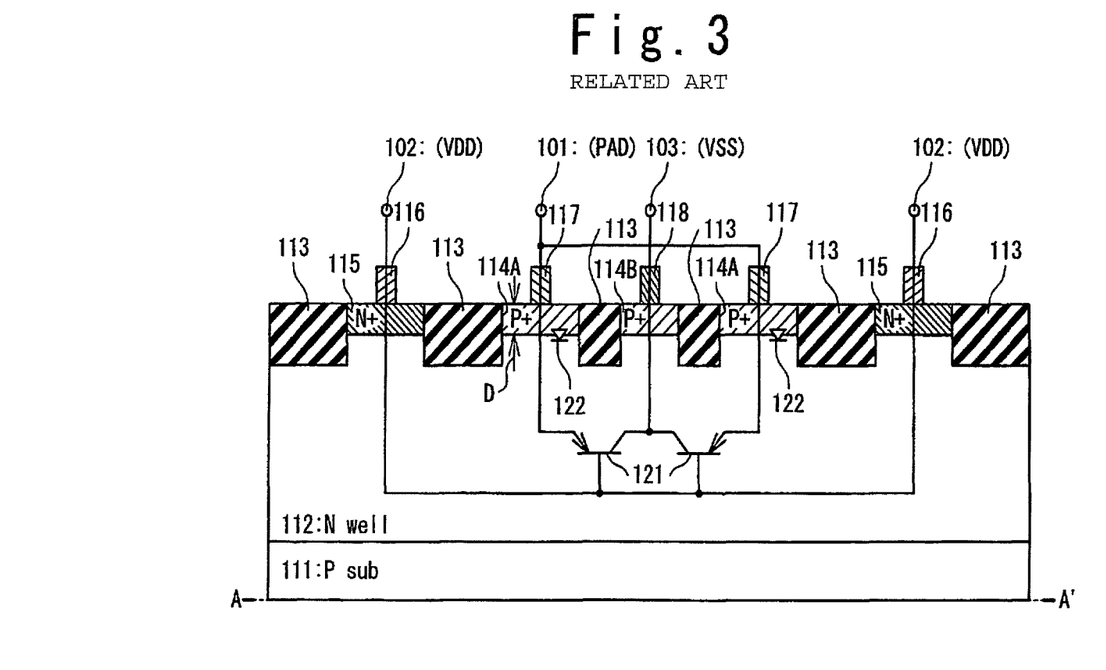
FIG. 3 is a cross-sectional view showing a structure of the ESD protection circuit in the conventional technique.

The ESD protection circuit 110 in the conventional technique will be described with reference to FIGS. 2 and 3. FIG. 2 is a plan view showing a layout example of the ESD protection circuit according to the conventional technique, and FIG. 3 is a cross-sectional view showing a cross-sectional structure of a semiconductor device along a line A-A' of FIG. 2. It should be noted that the VDD interconnection 102, an interconnection to be connected to the input/output pad 101, and the VSS interconnection 103 are omitted in FIG. 2.

The ESD protection circuit 110 in the conventional technique includes an N-type well 112 formed in the surface region of a P-type substrate 111 in a Z axis direction, in addition to an element isolation region 113, $P^+$-diffusion layers 114A and 114B, and $N^+$-diffusion layers 115, which are formed in the N-type well 112. The $N^+$-diffusion layer 115 is connected to the VDD interconnection 102 via a contact 116. The $P^+$-diffusion layer 114A is connected to the input/output pad 101 via a contact 117. The $P^+$-diffusion layer 114B is connected to the VSS interconnection 103 via a contact 118. The element isolation region 113 is exemplified by a field oxide film and is provided in a space interposed among the $P^+$-diffusion layers 114A and 114B and the $N^+$-diffusion layers 115. The element isolation region 113 is formed by LOCOS (Local Oxidation of Silicon) or STI (Shallow Trench Isolation).

By employing such a structure, the PNP bipolar transistor 121 is formed by using the $P^+$-diffusion layer 114A as an emitter (E), the $P^+$-diffusion layer 114B as a collector (C) and the $N^+$-diffusion layer 115 as a base (B). The $P^+$-diffusion layer 114A and the N-type well 112 also constitute a parasitic diode 122.

Here, if plus static electricity with a higher potential than the higher power supply VDD is applied to the input/output pad 101 due to the ESD, a snap-back operation of the PNP bipolar transistor 121 allows an overcurrent (i.e. ESD current) to flow from the $P^+$-diffusion layer 114A connected to the input/output pad 101 to the $P^+$-diffusion layer 114B connected to the VSS interconnection 103. This overcurrent flows through the PNP bipolar transistor 121 to protect the internal circuit 130. In contrast, if minus static electricity with a lower potential than the lower power supply VSS is applied to the input/output pad 101, a breakdown operation of the parasitic diode 122 to the PNP bipolar transistor 121 allows an overcurrent (i.e. ESD current) to flow from the $N^+$-diffusion layer 115 connected to the VDD interconnection 102 to the $P^+$-diffusion layer 114A connected to the input/output pad 101. Thus, the internal circuit 130 is protected from the ESD current.

Figure 4:
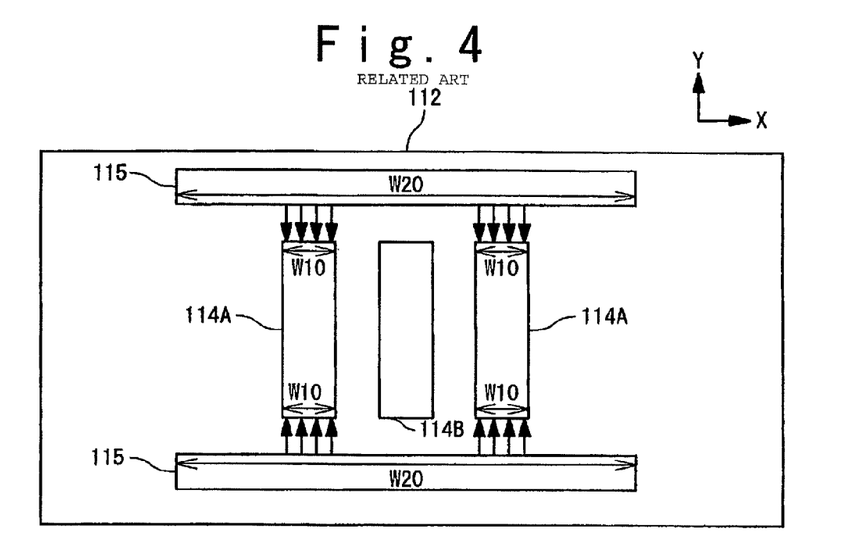
FIG. 4 is a conceptual view showing a current density of an ESD current flowing into a P$^+$-diffusion layer when minus static electricity is applied to an input/output pad in the ESD protection circuit according to the conventional technique.

FIG. 4 is a conceptual diagram showing a current density of the ESD current flowing into the $P^+$-diffusion layer 114A when minus static electricity is applied to the input/output pad 101. When the minus static electricity is applied to the input/output pad 101, the ESD current flows into the $P^+$-diffusion layer 114A via a region opposing to the $N^+$-diffusion layer 115 (i.e. region shown as the width W10 in FIG. 4). Referring to FIG. 4, the width W10 of the $P^+$-diffusion layer 114A opposing to the $N^+$-diffusion layer 115 is extremely narrower than the width W20 of the $N^+$-diffusion layer 115. Therefore, a current density of the ESD current in the region of the width W10 of the $P^+$-diffusion layer 114A is larger, and accordingly the $P^+$-diffusion layer 114A may be destroyed. That is, in the ESD protection circuit in the conventional technique, ESD resistance is very low with respect to minus static electricity.

SUMMARY

In an aspect of the present invention, an electrostatic discharge protection circuit has a bipolar transistor which includes: a first diffusion layer of a first conductive type connected with a first power supply and functioning as a base;

a second diffusion layer of a second conductive type connected with a second power supply and functioning as a collector; and a third diffusion layer of the second conductive type connected with an input/output pad and functioning as an emitter. An area of a first region of the third diffusion layer which is opposite to the first diffusion layer is larger than an area of a second region of the second diffusion layer which is opposite to the first diffusion layer.

In another aspect of the present invention, a semiconductor device includes: an internal circuit connected with a input/output pad, and first and second power supplies; and an electrostatic discharge protection circuit having a bipolar transistor, which includes: a first diffusion layer of a first conductive type connected with the first power supply and functioning as a base, a second diffusion layer of a second conductive type connected with the second power supply and functioning as a collector, and a third diffusion layer of the second conductive type connected with the input/output pad and functioning as an emitter. An area of a first region of the third diffusion layer which is opposite to the first diffusion layer is larger than an area of a second region of the second diffusion layer which is opposite to the first diffusion layer.

An ESD protection circuit according to the present invention makes it possible to improve ESD resistance.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, an Electrostatic Discharge (ESD) protection circuit according to the present invention will be described in detail with reference to the attached drawings.

First Embodiment

The ESD protection circuit 110 according to a first embodiment of the present invention will be described with reference to FIGS. 1, 5 and 6. FIG. 1 is a circuit diagram showing a structure of a semiconductor device provided with an ESD protection circuit 110 and a power supply protection circuit 120 in order to protect an internal circuit 130 from an ESD current. The internal circuit 130 is arranged between the VDD interconnection 102 connected to the higher power supply VDD and the VSS interconnection 103 connected to the lower power supply VSS, and is connected to the input/output pad 101 for inputting/outputting a signal. The ESD protection circuit 110 is provided with a PNP bipolar transistor 121 for causing an ESD current corresponding to plus static electricity to flow between the input/output pad 101 and the VSS interconnection 103, and a parasitic diode 122 for causing an ESD current corresponding to minus static electricity to flow between the input/output pad 101 and the VDD interconnection 102.

The structure of the ESD protection circuit 110 according to the first embodiment of the present invention will be described with reference to FIGS. 5 and 6. FIG. 5 is a plan view showing a layout structure of the ESD protection circuit 110 according to the first embodiment of the present invention. FIG. 6 is a cross-sectional view showing the semiconductor device along a line B-B' of FIG. 5. It should be noted that the VDD interconnection 102, an interconnection to be connected to the input/output pad 101, and the VSS interconnection 103 are omitted in FIG. 5.

The ESD protection circuit 110 according to the present embodiment includes an N-type well 112 formed in a surface region of a P-type substrate 111 in an upper direction of a Z axis, in addition to an element isolation region 113, P$^+$-diffusion layers 114A and 114B and N$^+$-diffusion layers 115, which are formed in the N-type well 112. The N$^+$-diffusion layer 115 is connected to the VDD interconnection 102 via a contact 116. The P$^+$-diffusion layer 14A is connected to the input/output pad 101 via a contact 117. The P$^+$-diffusion layer 114B is connected to the VSS interconnection 103 via a contact 118. It should be noted that the contacts 117 and 118, or the contact 116 and the contact 117 are not necessarily arranged on a same straight line and may be arranged in any positions.

Figure 5:
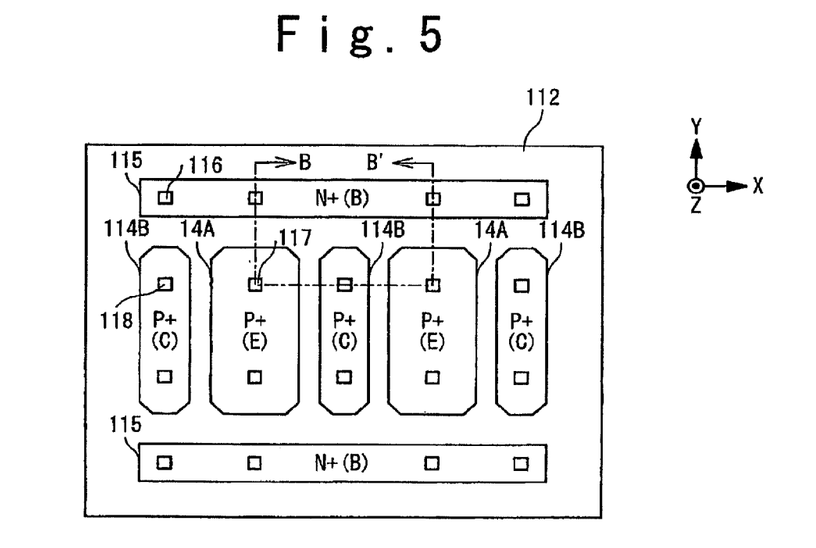
FIG. 5 is a plan view showing a layout structure of an ESD protection circuit according to a first embodiment of the present invention.
Figure 6:
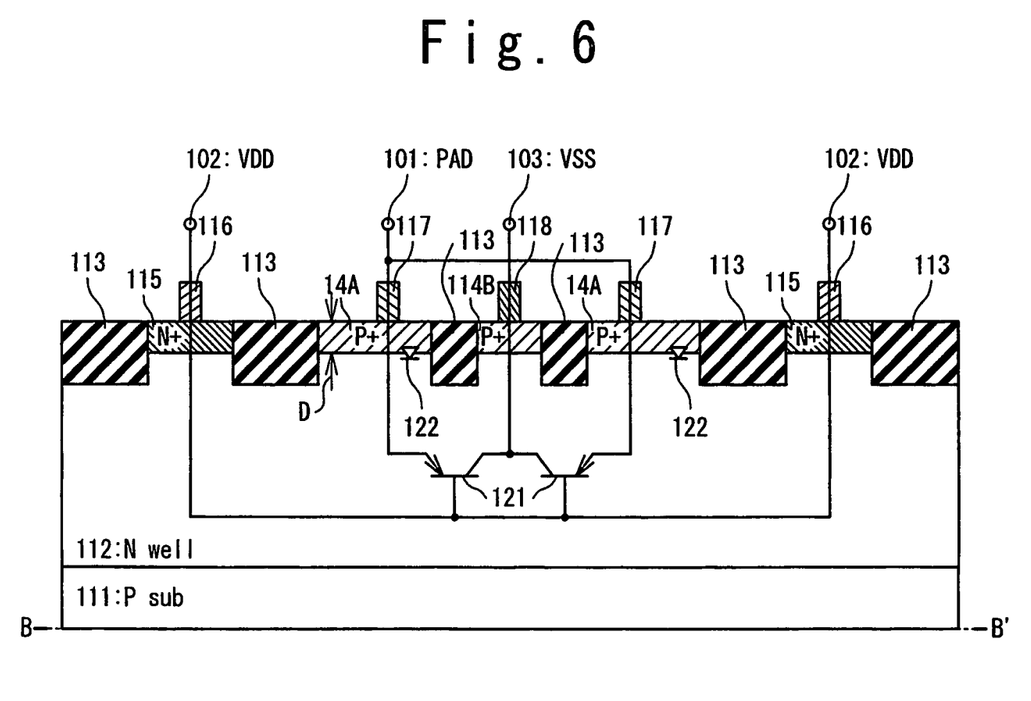
FIG. 6 is a cross-sectional view showing a structure of the ESD protection circuit according to the first embodiment of the present invention.

Referring to FIG. 5, the P$^+$-diffusion layers 14A and 114B are arranged alternately in an X-axis direction in FIG. 5. At least a part of the N$^+$-diffusion layer 115 is arranged in positions partially opposing the P$^+$-diffusion layers 14A and 114B. For example, the P$^+$-diffusion layers 14A and 114B are arranged between two of the N$^+$-diffusion layers 115 disposed in upper and lower directions of a Y axis, as shown in FIG. 5. Preferably, each of two N$^+$-diffusion layers 115 has a rectangular shape extending in the X-axis direction serving as a longitudinal direction. Referring to FIG. 6, the element isolation region 113 as being exemplified by a field oxide film is arranged in each of spaces interposed among the P$^+$-diffusion layers 14A and 114B and the N$^+$-diffusion layer 115.

By employing such a structure, the PNP bipolar transistor 121 is formed to have the P$^+$-diffusion layer 14A as an emitter (E), the P$^+$-diffusion layer 114B as a collector (C) and the N+-diffusion layer 115 as a base (B). The P+-diffusion layer 14A and the N-type well 112 also constitute the parasitic diode 122.

Referring to FIG. 5, in the P+-diffusion layer 14A, an area of a region opposing to the N+-diffusion layer 115 is set to a size which is enough to prevent element destruction due to the minus ESD current. In the P+-diffusion layer 14A, the area of the region opposing to the N+-diffusion layer 115 is calculated as a product of a width of the P+-diffusion layer 14A in the X-axis direction and a depth D of the diffusion layer in the Z-axis direction (refer to FIG. 6). Here, when the depth D of the diffusion layer is fixed, a width of the P+-diffusion layer 14A in the X-axis direction is preferably set to a size determined based on an amount of the ESD current flowing from the N+-diffusion layer 115. Meanwhile, the amount of the ESD current flowing from the N+-diffusion layer 115 is determined in accordance with the size of a region of the N+-diffusion layer 115 opposing the P+-diffusion layer 14A. Accordingly, the width of the P+-diffusion layer 14A in the X-axis direction is preferably set to a size determined based on the width of the N+-diffusion layer 115 in the X-axis direction.

Figure 7:
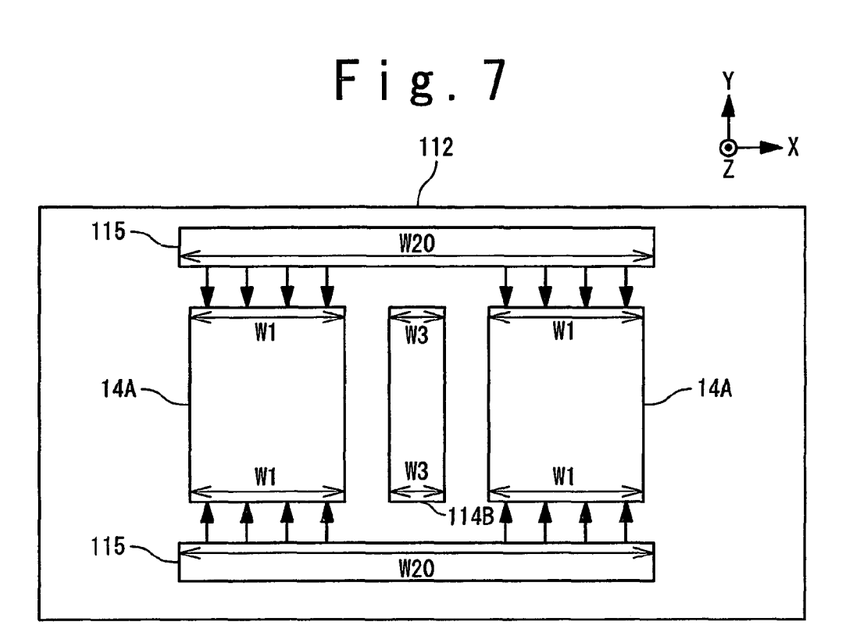
FIG. 7 is a conceptual view showing the current density of the ESD current flowing into the P$^+$-diffusion layer when minus static electricity is applied to an input/output pad according to the first embodiment.

FIG. 7 is a conceptual diagram showing a current density of the ESD current flowing into the P+-diffusion layer 14A when minus static electricity of a lower potential than that of the VSS power supply is applied to the input/output pad 101 according to the first embodiment. The minus static electricity applied to the input/output pad 101 flows as the ESD current from the N+-diffusion layer 115 connected to the higher power supply VDD to the P+-diffusion layer 14A connected to the input/output pad 101. The ESD current flowing into the P+-diffusion layer 14A flows via a region opposing the N+-diffusion layer 115 (i.e. region of the width W1 as shown in FIG. 7). At this time, a region of the width W1 is set to a size enough to prevent element destruction due to the ESD current. That is, the width W1 is set to be larger than the width W10 according to a conventional technique, whereby the ESD current to the P+-diffusion layer 14A is spread to realize a small current density of the ESD current in the region of the width W1 in comparison with the conventional technique. It is therefore possible to prevent element destruction due to an overcurrent (i.e. ESD current) caused by minus static electricity applied to the input/output pad 101, unlike the conventional technique.

A ratio of the width W1 of the P+-diffusion layer 14A with respect to the width W20 of the N+-diffusion layer 115 in the X-axis direction is preferably set to be larger than that of the conventional technique. Alternatively, the width W1 is preferably set to be larger than a width W3 of the P+-diffusion layer 114B in a region opposing the N+-diffusion layer 115 in the X-axis direction. Such a structure allows an overcurrent (i.e. ESD current) flowing from the N+-diffusion layer 115 to the P+-diffusion layer 14A to be spread in a wide region of the width W1, whereby ESD resistance in the P+-diffusion layer 14A or more precisely ESD resistance in the ESD protection circuit 110 is significantly improved.

Second Embodiment

Figure 8:
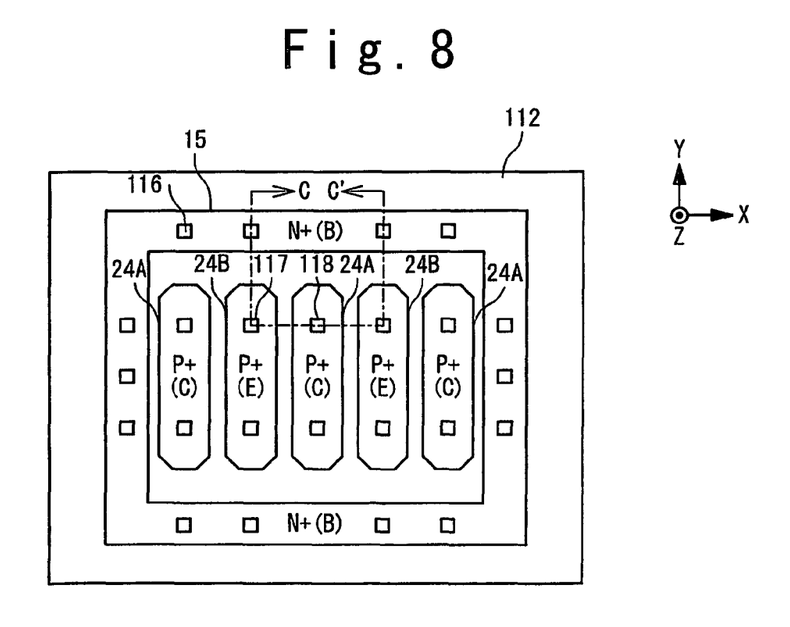
FIG. 8 is a plan view showing a layout structure of the ESD protection circuit according to a second embodiment of the present invention.
Figure 9:
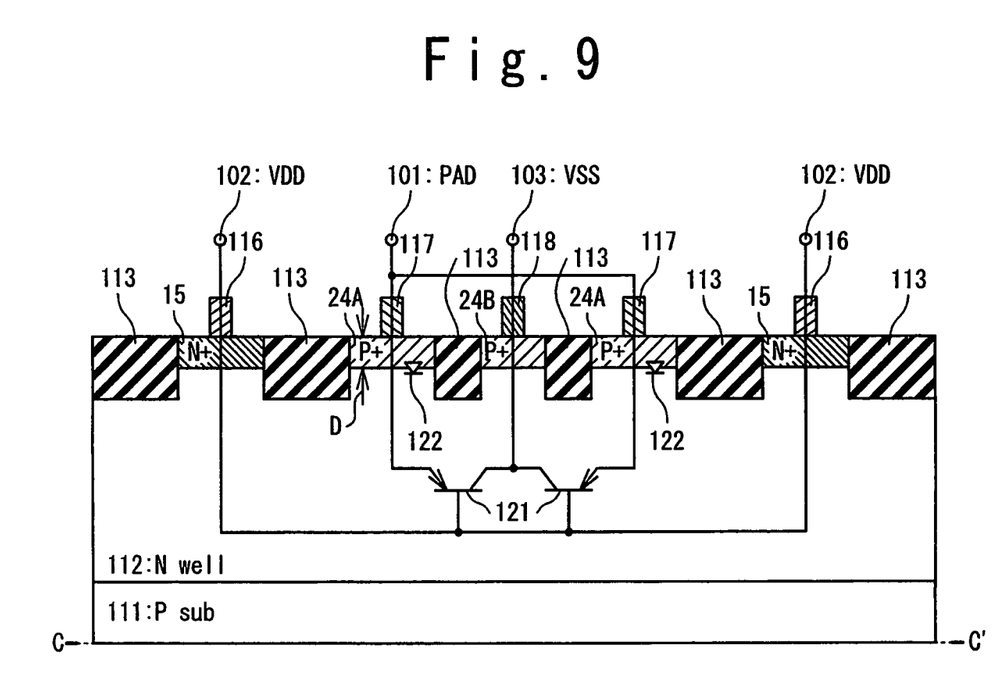
FIG. 9 is a cross-sectional view showing a structure of the ESD protection circuit according to the second embodiment of the present invention.

The ESD protection circuit 110 according to a second embodiment of the present invention will be described with reference to FIGS. 8 and 9. FIG. 8 is a plan view showing a layout structure of the ESD protection circuit 110 according to the second embodiment of the present invention. FIG. 9 is a cross-sectional view showing a semiconductor device along a line C-C' of FIG. 8. It should be noted that the VDD interconnection 102, an interconnection to be connected to the input/output pad 101, and the VSS interconnection 103 are omitted in FIG. 8.

The ESD protection circuit 110 according to the present embodiment includes the N-type well 112 formed in the surface region of the P-type substrate 111 in a direction of the Z axis, in addition to the element isolation region 113, P+-diffusion layers 24A and 24B, and an N+-diffusion layer 15, which are formed on the N-type well. The N+-diffusion layer 15 is connected to the VDD interconnection 102 via the contact 116. The P+-diffusion layer 24A is connected to the input/output pad 101 via the contact 117. The P+-diffusion layer 24B is connected to the VSS interconnection 103 via the contact 118. It should be noted that the contacts 117 and 118, or the contacts 116 and 117 are not necessarily arranged on a straight line and can be arranged in any positions.

Referring to FIG. 8, the P+-diffusion layers 24A and the P+-diffusion layers 24B are arranged alternately in the X-axis direction. The N+-diffusion layer 15 is divided into a portion arranged to oppose to the P+-diffusion layer 24A and the P+-diffusion layer 24B in the Y-axis direction and another portion arranged to oppose to only the P+-diffusion layer 24A in the X-axis direction. For example, the N+-diffusion layer 15A is preferably arranged annularly in the circumference of the P+-diffusion layers 24A and the P+-diffusion layers 24B as shown in FIG. 8. The P+-diffusion layers 24A and the P+-diffusion layers 24B are thus arranged alternately in the X-axis direction and the ratio of the numbers thereof shall be (n+1): 1 according to the present embodiment.

Referring to FIG. 9, the element isolation region 113 is exemplified by a field oxide film and is arranged in a space interposed among the P+-diffusion layers 24A and 24B and the N+-diffusion layer 15 in the same manner with the first embodiment.

By employing such a structure, the PNP bipolar transistor 121 is formed to have the P+-diffusion layer 24A as the emitter (E), the P+-diffusion layer 24B as the collector (C), and the N+-diffusion layer 15 as the base (B). The P+-diffusion layer 24A and the N-type well 112 also constitute the parasitic diode 122.

Referring to FIG. 8, each of the P+-diffusion layer 24A and the P+-diffusion layer 24B preferably has a rectangle having a long side in the Y-axis direction and a short side in the X-axis direction. In this case, an area of a region of the P+-diffusion layer 24A opposing the N+-diffusion layer 15 in the X-axis direction is equal to a product of the length of a long side thereof and the depth D of the diffusion layer (refer to FIG. 9), and therefore larger than an area of a region thereof opposing the N+-diffusion layer 15 in the Y-axis direction.

Figure 10:
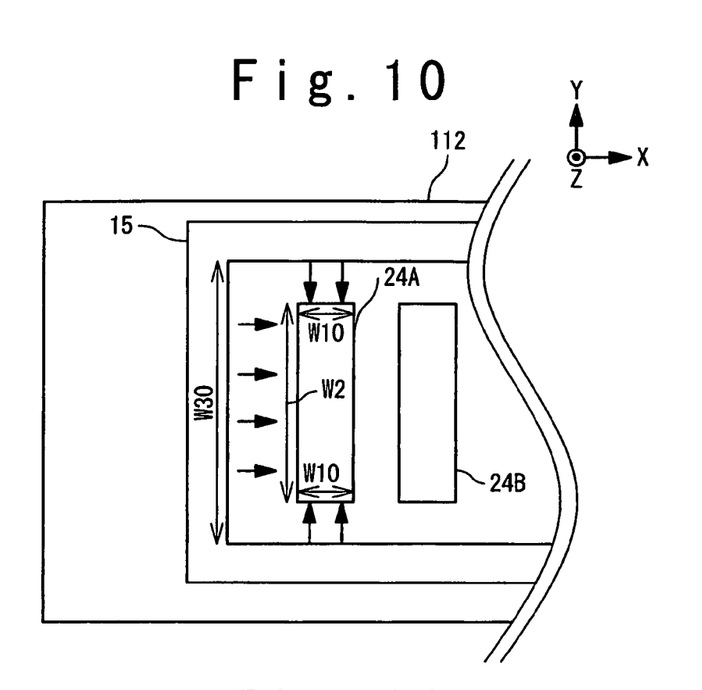
FIG. 10 is a conceptual view showing the current density of the ESD current flowing into the P$^+$-diffusion layer when the minus static electricity is applied to the input/output pad according to the second embodiment.
Figure 11:
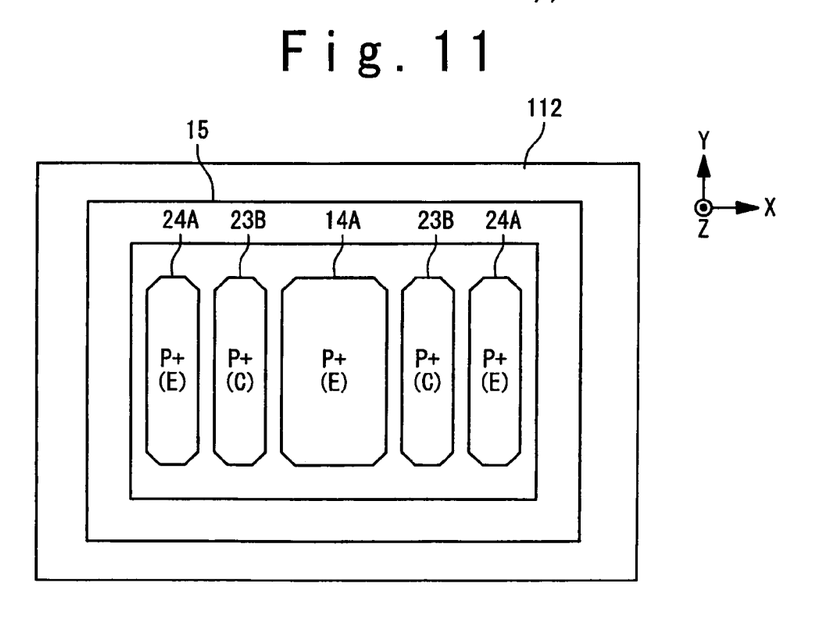
FIG. 11 is a plan view showing a modified example of a layout structure of the ESD protection circuit according to the present invention.

FIG. 10 is a conceptual diagram showing a current density of the ESD current flowing into the P+-diffusion layer 14A when minus static electricity of a lower potential than that of the VSS power supply is applied to the input/output pad 101 according to the second embodiment. The minus static electricity applied to the input/output pad 101 flows as an ESD current from the N+-diffusion layer 15 connected to the higher power supply VDD to the P+-diffusion layer 24A connected to the input/output pad 101. The ESD current flowing into the P+-diffusion layer 24A flows via a region opposing the N+-diffusion layer 15 (i.e. a region of the width W10 and a region of a width W2 as shown in FIG. 10). In the present embodiment, the ESD current flows not only in the region opposing the N+-diffusion layer 15 in the Y-axis direction (i.e. width W10) but also in the region of the width W2 opposing the N+-diffusion layer 15 in the X-axis direction. Therefore, a path of the ESD current flowing into the P+-diffusion layer 24A is dispersed and a current density of the ESD current with respect to the P$^+$-diffusion layer 24A is reduced in comparison with the conventional technique. It is therefore possible to prevent element destruction due to an overcurrent (i.e. ESD current) caused by minus static electricity applied to the input/output pad 101, unlike the conventional technique.

The present embodiment also provides the width W2 serving as a long side in the region opposing the N$^+$-diffusion layer 15 in the X-axis direction, so that the ESD current can be efficiently spread to reduce the current density. Therefore, the current density of the ESD current can be reduced while maintaining a width of a region of the P$^+$-diffusion layer 24A opposing the N$^+$-diffusion layer 15 in the Y-axis direction as the width W10, which is the same as that of the conventional technique as shown in FIG. 10. Accordingly, the ESD protection circuit 110 of the present embodiment can improve the ESD resistance while suppressing an increase in the circuit area.

Although the present invention has been described above, the present invention is not limited to specific structures in the above detailed embodiments and can include any changes modifications without deviating from the scope of the present invention. The PNP bipolar transistor 121 may also have a structure realized by combining the structures of the first embodiment and the second embodiment. For example, the PNP bipolar transistor 121 according to the second embodiment may also have a structure obtained by replacing the P$^+$-diffusion layer 24A interposed between the P$^+$-diffusion layers 24B with the P$^+$-diffusion layer 14 having a larger width in the X-axis direction. In the second embodiment, a path of the ESD current from the N$^+$-diffusion layer 15 to the P$^+$-diffusion layer 24A interposed between the P$^+$-diffusion layers 24B is provided to extend in the Y-axis direction via only a region opposing the N$^+$-diffusion layer 15. Therefore, ESD resistance in the P$^+$-diffusion layer 24A interposed between the P$^+$-diffusion layers 24B is equivalent to that of the conventional technique. In contrast, by replacing the P$^+$-diffusion layer interposed between the P$^+$-diffusion layers 24B with the P$^+$-diffusion layer 14A having the width W1, the current density of the ESD current can be reduced, to improve the ESD resistance in the P$^+$-diffusion layer interposed between the P$^+$-diffusion layers 24B.

Although the ESD protection circuit 110 provided with the PNP bipolar transistor 121 has been described in the aforementioned embodiments, the present invention can also be applied to an ESD protection circuit provided with an NPN bipolar transistor having the emitter (E) connected to the input/output pad 101, the base (B) connected to the VSS interconnection 103, and the collector (C) connected to the VDD interconnection 102. In this case, the N$^+$-diffusion layer connected to the input/output pad is set to have a large width so as to prevent element destruction due to the ESD current caused by plus static electricity with a higher potential than that of the positive potential power supply VDD applied to the input/output pad 101.

In the present invention, the width of a region opposing the N$^+$-diffusion layer is further increased in order to increase an area of a region into which the ESD current flows, but ESD resistance may be improved by deepening the depth D of the diffusion layer to reduce the current density of the ESD current.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. An electrostatic discharge protection circuit comprising a bipolar transistor which comprises:
   a first diffusion layer of a first conductive type connected with a first power supply and functioning as a base;
   a second diffusion layer of a second conductive type connected with a second power supply and functioning as a collector; and
   a third diffusion layer of the second conductive type connected with an input/output pad and functioning as an emitter,
   wherein an area of a first region of said third diffusion layer which horizontally aligns with said first diffusion layer, meaning an area of the first region of the diffusion layer having a top portion directly facing the first diffusion layer, is larger than an area of a second region of said second diffusion layer which horizontally aligns with said first diffusion layer, meaning an area of the second region of the second diffusion layer having a top portion directly facing the first diffusion layer.

2. The electrostatic discharge protection circuit according to claim 1, wherein a current flowing from said first diffusion layer to said third diffusion layer flows through said first region.

3. The electrostatic discharge protection circuit according to claim 1,
   wherein said second diffusion layer and said third diffusion layer are alternately arranged, and
   at least a portion of said first diffusion layer is opposite to said first region and said second region.

4. The electrostatic discharge protection circuit according to claim 3,
   wherein each of said second diffusion layer and said third diffusion layer comprises a rectangle with a short side and a long side,
   said second diffusion layer and said third diffusion layer are arranged such that said long side of said second diffusion layer and said long side of said third diffusion layer are opposite to each other, and
   said at least a portion of said first diffusion layer is arranged opposite to the short sides of said first region and said second region.

5. The electrostatic discharge protection circuit according to claim 3, wherein each of said second diffusion layer and said third diffusion layer comprises a rectangle with a short side and a long side,
   said second diffusion layer and said third diffusion layer are arranged such that said long side of said second diffusion layer and said long side of said third diffusion layer are opposite to each other, and
   at least a portion of said first diffusion layer is opposite to the long side of said third diffusion layer.

6. The electrostatic discharge protection circuit according to claim 3, wherein said first diffusion layer is arranged in a circumferential region to said second diffusion layer and said third diffusion layer.

7. The electrostatic discharge protection circuit according to claim 1, wherein a width of said third diffusion layer is set based on a width of said first diffusion layer.

8. The electrostatic discharge protection circuit according to claim 1, wherein a width of said third diffusion layer is set based on an amount of electrostatic discharge current to flow from said first diffusion layer.

9. The electrostatic discharge protection circuit according to claim 8, wherein the amount of the electrostatic discharge current to flow from said first diffusion layer is determined in accordance with a size of a region of said first diffusion layer which is opposite to said third diffusion layer.

10. The electrostatic discharge protection circuit according to claim 1, wherein said first diffusion layer comprises a continuous layer that surrounds said second diffusion layer and said third diffusion layer.

11. The electrostatic discharge protection circuit according to claim 1, wherein said first diffusion layer comprises a layer which encloses said second diffusion layer and said third diffusion layer.

12. The electrostatic discharge protection circuit according to claim 11, wherein said first diffusion layer comprises a rectangular shape.

13. A semiconductor device comprising:
an internal circuit connected with an input/output pad, and first and second power supplies; and
an electrostatic discharge protection circuit comprising a bipolar transistor, which comprises:
a first diffusion layer of a first conductive type connected with said first power supply and functioning as a base,
a second diffusion layer of a second conductive type connected with said second power supply and functioning as a collector, and
a third diffusion layer of the second conductive type connected with said input/output pad and functioning as an emitter,
wherein an area of a first region of said third diffusion layer which horizontally aligns with said first diffusion layer, meaning an area of the first region of the diffusion layer having a top portion directly facing the first diffusion layer, is larger than an area of a second region of said second diffusion layer which horizontally aligns with said first diffusion layer, meaning an area of the second region of the second diffusion layer having a top portion directly facing the first diffusion layer.

14. The semiconductor device according to claim 13, wherein a current flowing from said first diffusion layer to said third diffusion layer flows through said first region.

15. The semiconductor device according to claim 13, wherein said second diffusion layer and said third diffusion layer are alternately arranged, and
at least a portion of said first diffusion layer is opposite to said first region and said second region.

16. The semiconductor device according to claim 15, wherein each of said second diffusion layer and said third diffusion layer comprises a rectangle with a short side and a long side,
said second diffusion layer and said third diffusion layer are arranged such that said long side of said second diffusion layer and said long side of said third diffusion layer are opposite to each other, and
said at least a portion of said first diffusion layer is arranged opposite to the short sides of said first region and said second region.

17. The semiconductor device according to claim 15, wherein each of said second diffusion layer and said third diffusion layer comprises a rectangle with a short side and a long side,
said second diffusion layer and said third diffusion layer are arranged such that said long side of said second diffusion layer and said long side of said third diffusion layer are opposite to each other, and
at least a portion of said first diffusion layer is opposite to the long side of said third diffusion layer.

18. The semiconductor device according to claim 15, wherein said first diffusion layer is arranged in a circumferential region to said second diffusion layer and said third diffusion layer.

* * * * *